United States Patent
Nishimura

(10) Patent No.: US 8,746,171 B2
(45) Date of Patent: Jun. 10, 2014

(54) SUBSTRATE TREATING SYSTEM

(75) Inventor: Joichi Nishimura, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 766 days.

(21) Appl. No.: 12/191,603

(22) Filed: Aug. 14, 2008

(65) Prior Publication Data

US 2009/0044747 A1 Feb. 19, 2009

(30) Foreign Application Priority Data

Aug. 14, 2007 (JP) ................................ 2007-211273

(51) Int. Cl.
  *B05C 11/10* (2006.01)
  *B05C 13/02* (2006.01)
  *G03D 5/00* (2006.01)

(52) U.S. Cl.
  USPC ........... 118/699; 118/665; 118/641; 118/500; 396/611

(58) Field of Classification Search
  USPC ........... 118/500, 503, 52, 612, 319, 320, 699, 118/700, 641–643, 665, 686; 396/611, 604, 396/627; 29/25.01; 414/935; 355/27, 53
  See application file for complete search history.

(56) References Cited

U.S. PATENT DOCUMENTS

| | | | |
|---|---|---|---|
| 5,952,149 A | 9/1999 | Sakai et al. | |
| 5,980,591 A * | 11/1999 | Akimoto et al. | ............. 29/25.01 |
| 6,022,672 A | 2/2000 | Ikeda | |
| 6,203,617 B1 * | 3/2001 | Tanoue et al. | ................. 118/695 |
| 6,313,903 B1 * | 11/2001 | Ogata | .............................. 355/27 |
| 7,018,932 B2 | 3/2006 | Ito et al. | |
| 7,210,864 B2 | 5/2007 | Higashi et al. | |
| 7,641,404 B2 | 1/2010 | Hamada | |
| 2002/0011207 A1 * | 1/2002 | Uzawa et al. | .................. 118/666 |
| 2005/0061247 A1 | 3/2005 | Shibata et al. | |
| 2007/0121092 A1 | 5/2007 | Mochizuki et al. | |
| 2007/0159615 A1 | 7/2007 | Horiuchi | |
| 2008/0299500 A1 | 12/2008 | Kawamata | |

FOREIGN PATENT DOCUMENTS

| | | |
|---|---|---|
| JP | 7-142356 | 6/1995 |
| JP | 8-262699 | 10/1996 |
| JP | 10-275847 | 10/1998 |
| JP | 11-154637 | 6/1999 |
| JP | 2003-257834 | 9/2003 |
| JP | 2003-324139 | 11/2003 |
| JP | 2005-101029 | 4/2005 |
| JP | 2005-294460 | 10/2005 |
| JP | 2006-32555 | 2/2006 |
| JP | 2006-147638 | 6/2006 |

(Continued)

OTHER PUBLICATIONS

Notice of Allowance of Japanese Application No. 2007-211273, dated Nov. 13, 2012.

(Continued)

*Primary Examiner* — Yewebdar Tadesse

(74) *Attorney, Agent, or Firm* — Ostrolenk Faber LLP

(57) ABSTRACT

A substrate treating system includes a coating apparatus having a resist coating unit, an exposing apparatus having an exposing machine and a heat-treating unit, and a controller for controlling the resist coating unit, exposing machine and heat-treating unit. The controller coordinates schedules of treatment in the coating apparatus and exposing apparatus, such that the coating apparatus can operate efficiently despite an increase in the processing time of the exposing machine.

16 Claims, 8 Drawing Sheets

(56) References Cited

FOREIGN PATENT DOCUMENTS

| | | |
|---|---|---|
| JP | 2007-165778 | 6/2007 |
| JP | 2007-180238 | 7/2007 |
| JP | 2007-201214 | 8/2007 |
| JP | 2008-300578 | 12/2008 |
| WO | 2007/080779 | 7/2007 |

OTHER PUBLICATIONS

Office Action dated May 29, 2012 in corresponding Japanese Application JP2007-211273.

* cited by examiner

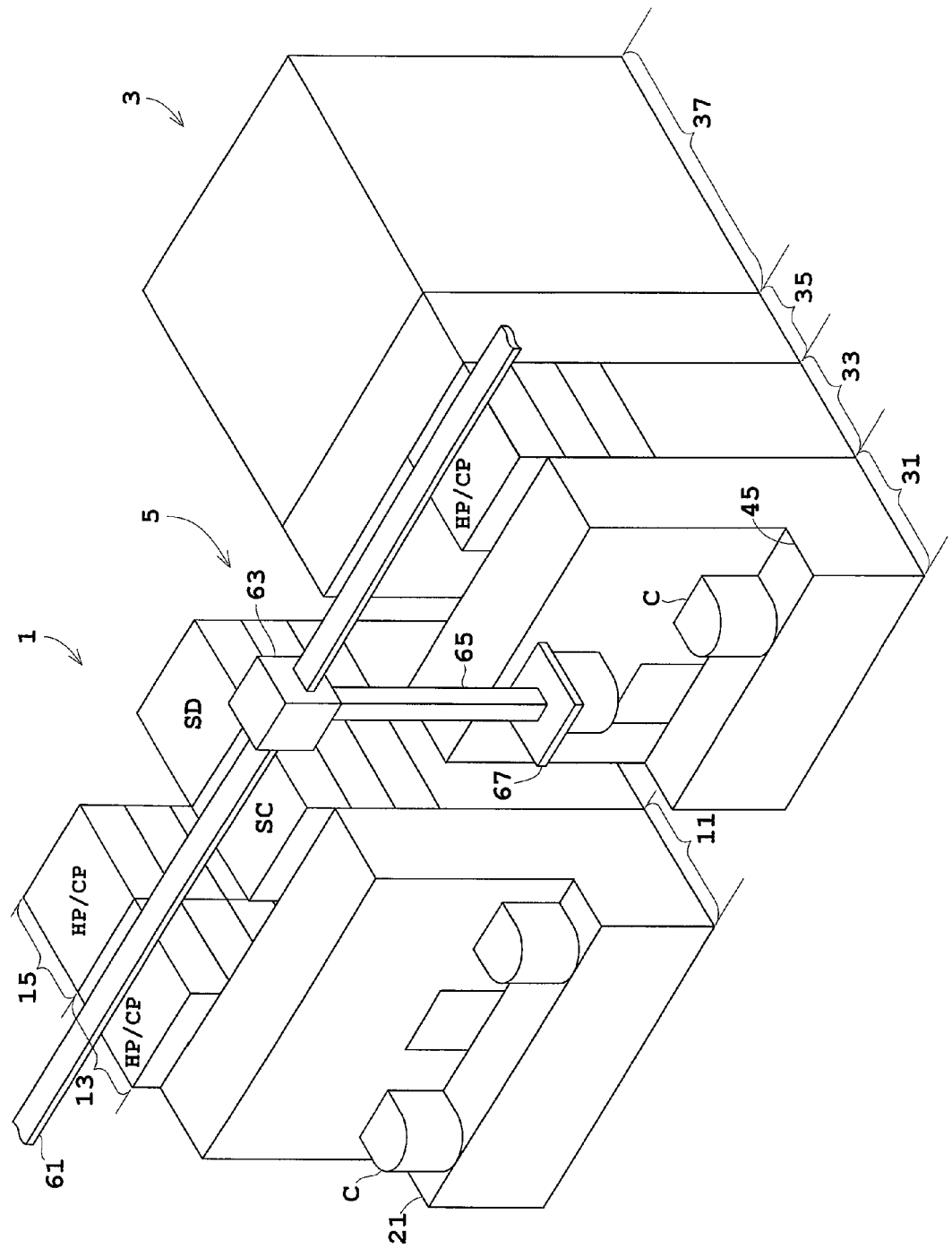

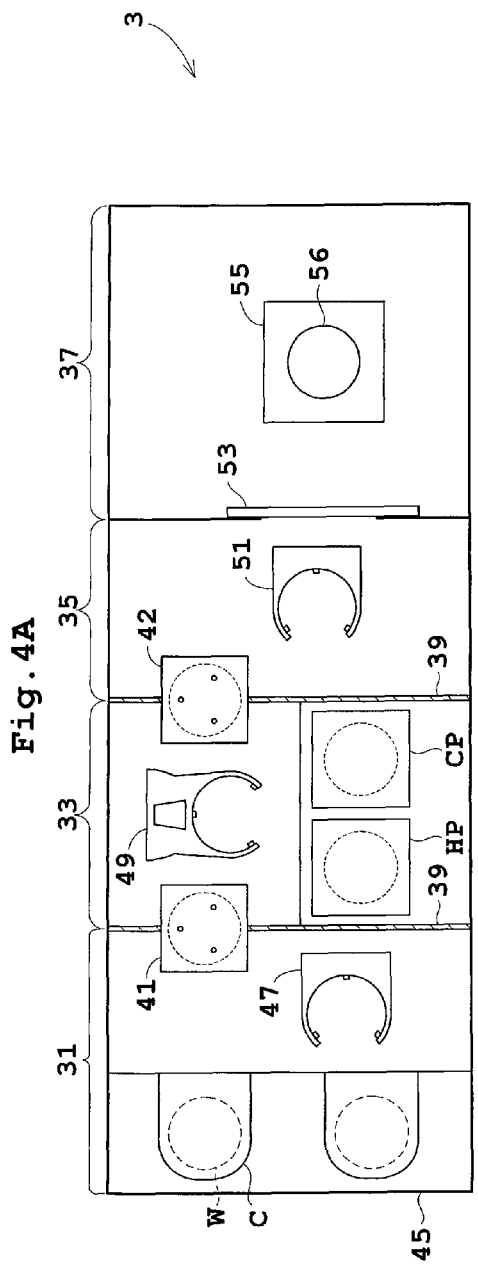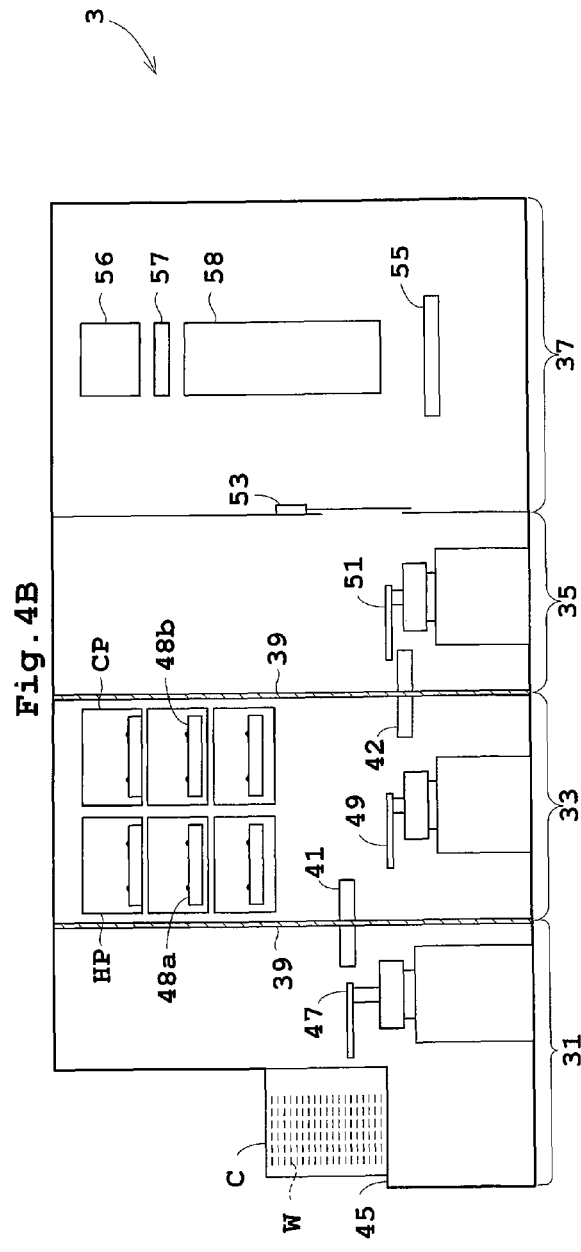

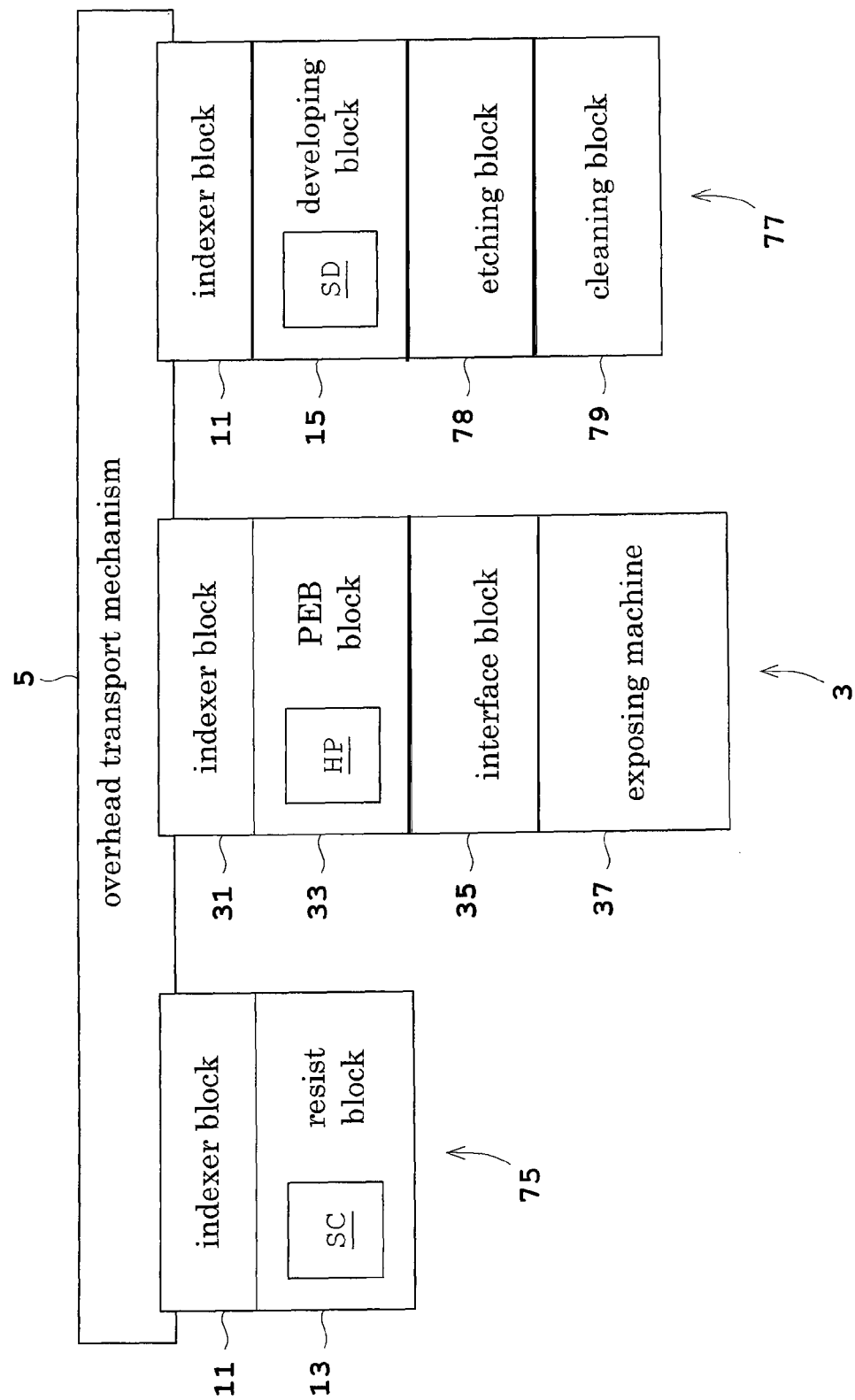

SUBSTRATE TREATING SYSTEM

BACKGROUND OF THE INVENTION (1) Field of the Invention

This invention relates to a substrate treating system for treating semiconductor substrates, glass substrates for liquid crystal displays, glass substrates for photomasks, substrates for optical disks and so on (hereinafter called simply "substrates"). The treating system is constructed to expose substrates having resist film formed thereon, coat the substrates with the resist film before the exposing process, and/or develop the substrates after the exposing process.

(2) Description of the Related Art

The general flow of a lithographic process is divided roughly into (1) resist coating, (2) exposure, (3) post-exposure bake (hereinafter referred to as "PEB" where appropriate), (4) development, (5) etching, and (6) resist removal. The reaction of resist film on exposed portions starting in the step of (2) exposure continues through the step of (3) PEB, and stops when substrates are subjected to a cooling step. Thus, in the lithographic process, the steps of (2) exposure and (3) PEB, and the cooling step associated therewith need to be carried out at a stretch and cannot be separated in time.

Further, to cope with an increasingly refined linewidth of patterns, there are methods in which exposure is done twice in different patterns using two types of masks (in what is called double exposure). In one method, for example, one of the masks is used for a vertical pattern, and the other mask for a horizontal pattern. In another method, patterns are exposed such that, between patterns projected through one of the masks, a pattern according to the other mask is located. A lithographic process for such double exposure is carried out in a procedure of repeating only (2) exposure twice in succession, or in a procedure of repeating twice a plurality of steps from (1) resist coating to (6) resist removal, for example.

FIG. 1 shows an outline of a conventional apparatus that carries out treatments from (1) resist coating to (4) development noted above. This substrate treating apparatus includes an indexer block 81, a resist block 83, a developing block 85, an interface block 87 and an exposing machine 89, which are connected in-line. Each of the resist block 83 and developing block 85 has heating units HP and cooling units CP, besides resist coating units SC or developing units SD, for heat-treating wafers W as appropriate in the course of resist coating or development. The heating units HP of the developing block 85 are used in the treatment for (3) PEB noted above. The respective blocks 81, 83 and 85 have transport mechanisms 91, 93 and 95 for transporting wafers W. The interface block 87 also has a transport mechanism not shown.

In the substrate treating apparatus constructed in this way, a wafer W is first fed from the indexer block 81 to the resist block 83, and loaded into one of the resist coating units SC. After resist film is formed on the wafer W, the wafer W is transported to the exposing machine 89. The wafer W having been exposed is transported to the developing block 85. In the developing block 85, the wafer W is loaded into a heating unit HP, cooling unit CP and developing unit SD for PEB in the stated order. The wafer W undergoes predetermined treatment in each of these units HP, CP and SD. After the treatment in the developing block 85, the wafer W is transported back to the indexer block 81. The transport mechanism 91 deposits the wafer W having undergone the series of treatments in a storage container C (as disclosed, for example, in Japanese Unexamined Patent Publications No. 2003-324139 and H11-154637).

However, the following drawback is encountered when the conventional apparatus carries out a lithographic process for double exposure, and especially when exposure is done twice in succession in the step of (2) exposure. The time taken by the exposing machine 89 in exposing each substrate becomes approximately twice as long, and the extended processing time of the exposing machine 89 has an adverse influence of lowering the operating rates of the resist block 83 and developing block 85.

SUMMARY OF THE INVENTION

This invention is has been made having regard to the state of the art noted above, and its object is to provide a substrate treating system for carrying out predetermined treatment in a lithographic process efficiently while inhibiting the influence of an extended processing time of an exposing machine.

The above object is fulfilled, according to this invention, by a substrate treating system comprising a coating apparatus including a resist coating unit for forming resist film on substrates; an exposing apparatus constructed separately from the coating apparatus, and including an exposing machine for exposing the substrates having the resist film formed thereon, and a heat-treating unit for heating the substrates exposed; and a control device for controlling the resist coating unit, the exposing machine and the heat-treating unit while adjusting schedules of treatments in the coating apparatus and the exposing apparatus.

According to this invention, the coating apparatus is constructed separately from the exposing apparatus having an exposing machine. This construction is free from a restriction that the substrates having resist film formed thereon by the resist coating unit are fed only to the particular exposing machine. Thus, the operating rate of the coating apparatus is not influenced by an increase in the processing time of the exposing machine. The process of applying a resist to the substrates to form resist film thereon is carried out efficiently.

In the invention noted above, the control device may be arranged, when the coating apparatus is resting from treatment of substrates to be transferred to the exposing apparatus, to permit treatment of substrates to be transferred to an apparatus other than the exposing apparatus. Then, the coating apparatus is operated efficiently.

The coating apparatus may include a first controller for controlling the coating unit, the exposing apparatus may include a second controller for controlling the exposing machine and the heat-treating unit, the second controller being capable of communicating with the first controller, and the control device may comprise the first controller and the second controller. This construction permits the coating apparatus and exposing apparatus, which are separate entities, to carry out treatments in a coordinated way.

The control device may further include a host computer in communication with the first controller and the second controller. This construction also permits the coating apparatus and exposing apparatus, which are separate entities, to carry out treatments in a coordinated way.

Each of the coating apparatus and the exposing apparatus may include an indexer block for moving the substrates into and out of a container constructed for storing a plurality of substrates, the system further comprising a transport device for transporting the container between the indexer blocks of the coating apparatus and the exposing apparatus, and the control device may be arranged to control the transport device also. This construction is effective to realize coordination between the separate coating apparatus and exposing apparatus.

The coating apparatus may further include a developing unit for developing the substrates exposed. Then, the substrates can be developed efficiently.

In another aspect of this invention, a substrate treating system comprises an exposing apparatus including an exposing machine for exposing substrates, and a heat-treating unit for heating the substrates exposed; a developing apparatus constructed separately from the exposing apparatus, and including a developing unit for developing the substrates exposed; and a control device for controlling the exposing machine, the heat-treating unit and the developing unit while adjusting schedules of treatments in the exposing apparatus and the developing apparatus.

According to this invention, the developing apparatus is constructed separately from the exposing apparatus having an exposing machine. The substrates to be treated by the developing unit are not limited to those exposed by the particular exposing machine. Thus, the operating rate of the developing apparatus is not influenced by an increase in the processing time of the exposing machine. The developing process is carried out efficiently.

In the invention noted above, the control device may be arranged, when the developing apparatus is resting from treatment of substrates transferred from the exposing apparatus, to permit treatment of substrates transferred from an apparatus other than the exposing apparatus. Then, the developing apparatus is operated efficiently.

The developing apparatus may include a first controller for controlling the developing unit; the exposing apparatus may include a second controller for controlling the exposing machine and the heat-treating unit, the second controller being capable of communicating with the first controller; and the control device may comprise the first controller and the second controller. This construction permits the developing apparatus and exposing apparatus, which are separate entities, to carry out treatments in a coordinated way.

The control device may further include a host computer in communication with the first controller and the second controller. This construction also permits the developing apparatus and exposing apparatus, which are separate entities, to carry out treatments in a coordinated way.

Each of the developing apparatus and the exposing apparatus may include an indexer block for moving the substrates into and out of a container constructed for storing a plurality of substrates, the system further comprising a transport device for transporting the container between the indexer blocks of the developing apparatus and the exposing apparatus, and the control device may be arranged to control the transport device also. This construction is effective to realize coordination between the separate exposing apparatus and developing apparatus.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIG. 2 is a perspective view showing an outline of a substrate treating system according to this invention;

FIG. 4A is a plan view showing an outline of an exposing apparatus;

FIG. 4B is a sectional view showing an outline of the exposing apparatus;

FIG. 7 is a schematic view showing an outline of a substrate treating system in another modified embodiment;

DESCRIPTION OF THE PREFERRED EMBODIMENTS

A preferred embodiment of this invention will be described in detail hereinafter with reference to the drawings.

Figure 1:
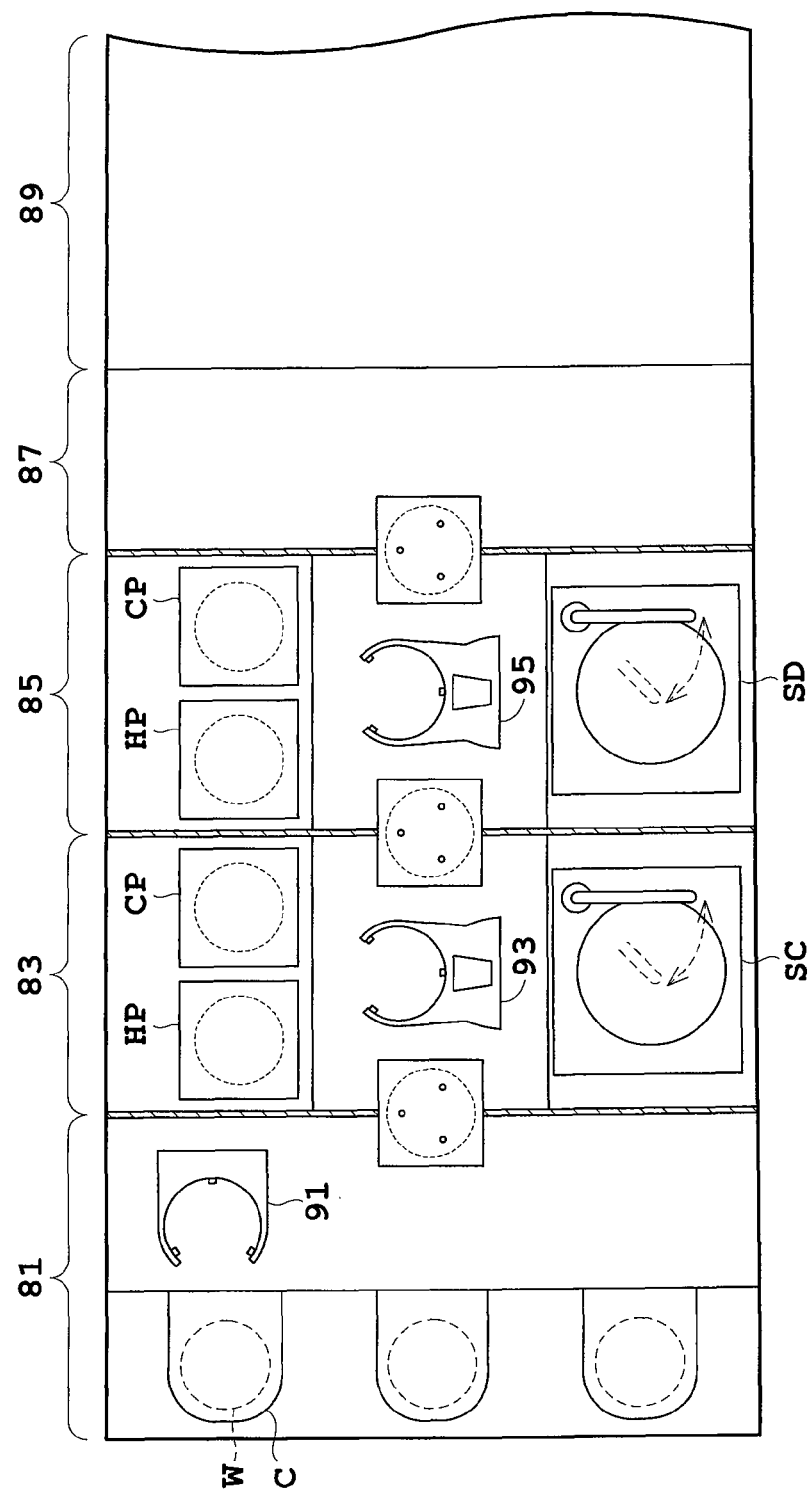
FIG. 1 is a plan view showing an outline of a substrate treating apparatus according to the prior art.
Figure 3A:
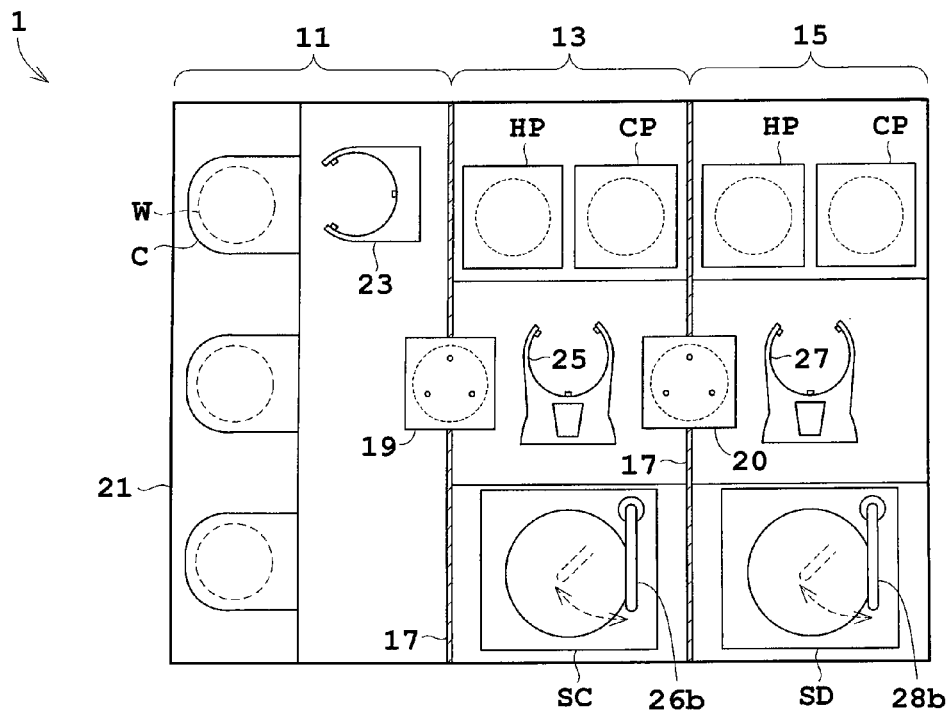
FIG. 3A is a plan view showing an outline of a coating and developing apparatus.
Figure 3B:
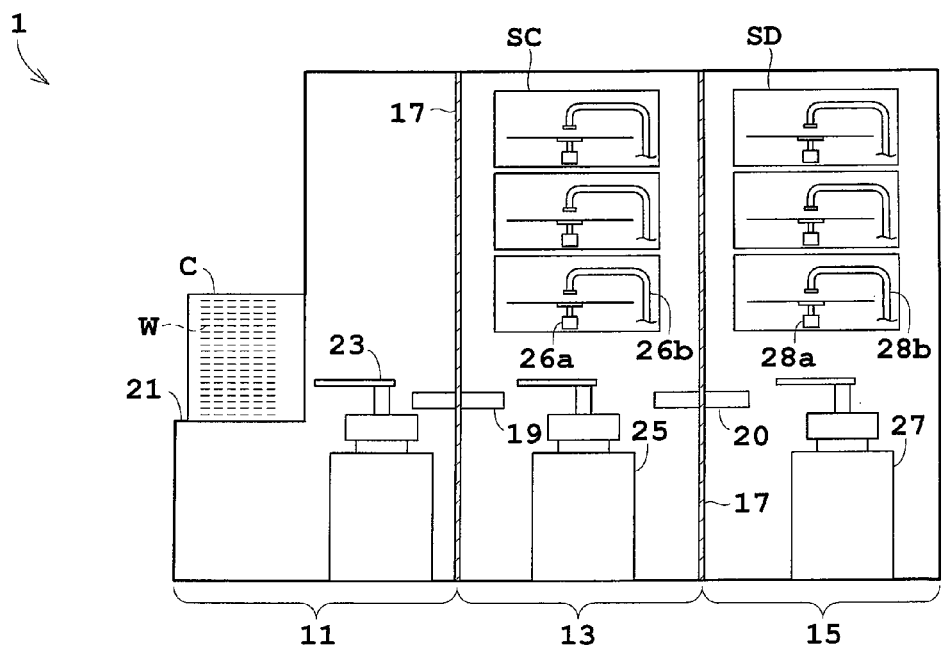
FIG. 3B is a sectional view showing an outline of the coating and developing apparatus.

FIG. 2 is a perspective view showing an outline of a substrate treating system according to this invention. FIG. 3A is a plan view showing an outline of a coating and developing apparatus. FIG. 3B is a sectional view showing an outline of the coating and developing apparatus. FIG. 4A is a plan view showing an outline of an exposing apparatus. FIG. 4B is a sectional view showing an outline of the exposing apparatus.

The substrate treating system in this embodiment is constructed for carrying out treatments such as resist coating, exposure and development of wafers (e.g. semiconductor wafers) W. The substrate treating system includes a coating and developing apparatus 1 and an exposing apparatus 3 formed separately from each other, and an overhead transport mechanism 5 for transporting containers C with wafers W stored therein between the coating and developing apparatus 1 and exposing apparatus 3. The containers C are, for example, what is called FOUPs (front opening unified pods) of the encapsulated type. The coating and developing apparatus 1 corresponds to the coating apparatus and the developing apparatus in this invention.

The coating and developing apparatus 1 includes an indexer block 11, a resist block 13 and a developing block 15 arranged in the stated order in a row. Partitions 17 are erected between these blocks 11, 13 and 15 for shielding off atmosphere. Each partition 17 has an opening formed in a substantially middle position thereof in plan view. These openings have receivers 19 and 20 for receiving wafers W placed thereon.

The indexer block 11 includes a container support table 21 on which the containers C are placed, and an indexer transport mechanism 23 slidable along the container support table 21. The indexer transport mechanism 23 is constructed also to be vertically movable and swivelable to transport wafers W between each container C on the support table 21 and the receiver 19 disposed between the indexer block 11 and resist block 13.

The resist block 13 includes a plurality of resist coating units SC stacked in multiple stages in one side thereof, and a plurality of heating units HP and cooling units CP arranged in the other side. The resist block 13 further includes a resist transport mechanism 25 disposed in the center thereof to be vertically movable and swivelable. The resist transport mechanism 25 transports wafers W between the units SC, HP and CP arranged in the opposite sides, and the receivers 19 and 20 located at the front and rear ends. Each resist coating unit SC has a substrate holder 26a for holding a wafer W to be rotatable in horizontal posture, and a nozzle 26b for applying a resist (e.g. chemically amplified resist) to the wafer W, and carries out treatment for forming resist film on the wafer W. Each of the heating units HP and cooling units CP has a heating plate or cooling plate (not shown) adjusted to a predetermined temperature for heating or cooling wafers W at the predetermined temperature.

The developing block 15 includes a plurality of developing units SD stacked in multiple stages in one side thereof, and a plurality of heating units HP and cooling units CP arranged in the other side. The developing block also includes a developing transport mechanism 27 disposed in the center thereof to be vertically movable and swiveable. The developing transport mechanism 27 transports wafers W between the units SD, HP and CP, and the receiver 20. Each developing unit SD has a substrate holder 28a for holding a wafer W to be rotatable in horizontal posture, and a nozzle 28b for supplying a developer to the wafer W, and carries out developing treatment of the wafer W.

Next, the exposing apparatus 3 will be described with reference to FIGS. 4A and 4B. The exposing apparatus 3 includes an indexer block 31, a PEB block 33, an interface block 35 and an exposing machine 37 arranged in the stated order in a row. The exposing machine 37 is connected in-line to the PEB block 33 through the interface block 35. Partitions 39 are erected between the blocks 31, 33 and 35 of the exposing apparatus 3 for shielding off atmosphere. Each partition 39 has an opening formed in a position to one side from the middle position of the exposing apparatus 3 in plan view. These openings have receivers 41 and 42 for receiving wafers W placed thereon. Between the interface block 35 and exposing machine 37, atmosphere is shielded off by a housing of the exposing machine 37. The interface block 35 and exposing machine 37 can communicate with each other through a substrate loading port openable and closable by a shutter device 53.

The indexer block 31 has substantially the same construction as the indexer block 11 disposed in the coating and developing apparatus 1. That is, the indexer block 31 includes a container support table 45 on which the containers C are placed, and an indexer transport mechanism 47 movable while being vertically movable and swiveable. The indexer transport mechanism 47 transports wafers W between each container C on the support table 45 and the receiver 41.

The PEB block 33 includes a plurality of heating units HP and cooling units CP arranged in one side thereof, and a PEB transport mechanism 49 disposed in the other side. Each of the heating units HP and cooling units CP has a heating plate 48a or a cooling plate 48b adjusted to a predetermined temperature for carrying out predetermined heat treatment of wafers W placed thereon. The PEB transport mechanism 49 transports wafers W between the units HP and CP and the front and rear receivers 41 and 42. The heating units HP arranged in the PEB block 33 correspond to the heat-treating unit in this invention.

The interface block 35 has an interface transport mechanism 51 constructed swivelable. The interface transport mechanism 51 is interlocked to the shutter device 53 to load and unload wafers W into/out of the exposing machine 51, and transfers the wafers W to and from the PEB transport mechanisms 49 through the receiver 42.

The exposing machine 37 includes a stage 55 on which a wafer W is placed, an illumination system 56, masks 57, and projection optics 58 for projecting the images of patterns of masks 57 to the wafer W on the stage 55, thereby exposing the wafer W. The illumination system 56 has a light source such as an ArF, for example. The masks 57 are switchable by a mask switching mechanism (not shown).

Next, the overhead transport mechanism 5 will be described. The overhead transport mechanism 5 includes a rail 61 extending horizontally and linearly between areas over the container support tables 21 and 45 of the coating and developing apparatus 1 and exposing apparatus 3, a transport box 63 movable along the rail 61, a support rod 65 extendably and retractably extending downward from the transport box 63, and a holder 67 attached to the lower end of the support rod 65. The holder 67 has an engaging mechanism (not shown) for engaging an upper part of each container C to hold the container C, and canceling the engagement to release the container C. The transport box 63 has various drive mechanisms arranged therein. These drive mechanisms are operable to move the transport box 63, extend and retract the support rod 65, and actuate the engaging mechanism for engaging and disengaging operations. The overhead transport mechanism 5 constructed in this way transports the containers C between the coating and developing apparatus 1 and exposing apparatus 3. The overhead transport mechanism 5 corresponds to the transport device in this invention.

Figure 5:
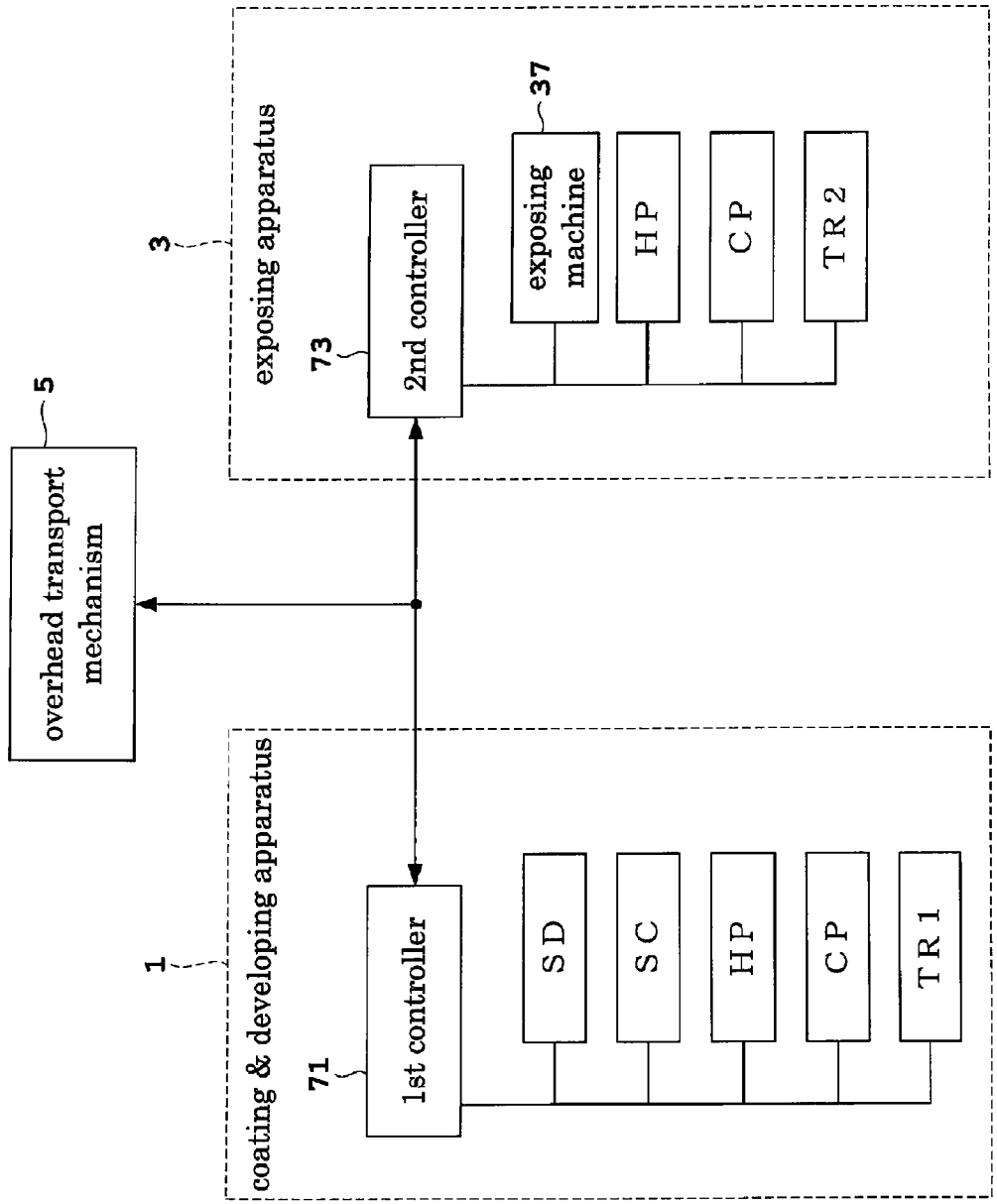
FIG. 5 is a block diagram of a control system of the substrate treating system.

Next, a control system of this substrate treating system will be described with reference to FIG. 5. FIG. 5 is a block diagram of the control system of the substrate treating system. The coating and developing apparatus 1 and exposing apparatus 3 have a first controller 71 and a second controller 73, respectively. The first controller 71 performs overall control of the units SD, SC, HP and CP and transport mechanisms 23, 25 and 27 (which will be referred to collectively as "first transporting system TR1" where appropriate) of the coating and developing apparatus 1. The second controller 3 performs overall control of the heating and cooling plates HP and CP, exposing machine 37, and transport mechanisms 47, 49 and 51 (which will be referred to collectively as "second transporting system TR2" where appropriate) of the exposing apparatus 3. Further, the first and second controllers 71 and 73 maintain individually information including histories of treatment of wafers W.

These first and second controllers 71 and 73 can communicate with each other, and with the overhead transport mechanism 5, respectively. The first and second controllers 71 and 73, while cooperating with each other, cause the wafers W to be treated in the coating and developing apparatus 1 and exposing apparatus 3, respectively. The first and second controllers 71 and 73 control the overhead transport mechanism 5 for transporting the containers C between the coating and developing apparatus 1 and exposing apparatus 3. Each of the first and second controllers 71 and 73 includes a central processing unit (CPU) for reading and executing predetermined programs, and storage media for storing a variety of information, such as a ROM (Read Only Memory), a RAM (Random Access Memory) and a fixed disk.

Next, operation of the substrate treatment system in this embodiment will be described.

<Coordination Between Coating and Developing Apparatus and Exposing Apparatus>

First, the first controller 71 asks the second controller 73 for information on a schedule of exposing treatment. For example, the first controller 71 inquires about an optimal time or period for transporting a wafer W having resist film formed thereon to the exposing apparatus 3. Or an inquiry is made whether or not a wafer W can be exposed promptly, in case the wafer W is newly transported to the exposing apparatus 3 a certain time from now which is determined by counting backward from the time taken in forming resist film.

In response to such an inquiry, the second controller 73 refers to the number of wafers W remaining to be treated in the exposing apparatus 3, deduces a schedule of exposing treatment, and answers the inquiry of the first controller 71 based on this schedule. At this time, the second controller 73 informs also a time at which the treatment, e.g. exposure, in the exposing apparatus 3 will finish.

In this way, the first and second controllers 71 and 73 check the treatment schedules of the coating and developing apparatus 1 and exposing apparatus 3 against each other, to adjust timing of allowing wafers W to be exposed appropriately in the exposing apparatus 3, and the number of wafers W that can be appropriately exposed with this timing. Adjustment is made also to schedules of predetermined lithographic steps including resist coating and development carried out before and after exposure.

The first controller 71 cooperates with the second controller 73 as described above, to determine operating schedules of the resist coating units SC, including times for starting the treatment to form resist film, periods of the treatment, and the number of wafers W to be treated. In addition, the first controller 71 determines operating schedules of the developing units SD, including times for starting developing treatment and periods of the treatment.

<Resist Film Formation>

When time comes for starting the treatment for forming resist film, the coating and developing apparatus 1 will operate as follows. The transporting system TR1 fetches a wafer W from a container C placed on the container support table 21, and transports the wafer W to one of the resist coating units SC. The resist coating unit SC forms resist film in a predetermined thickness on the surface of the wafer W. The transporting system TR1 deposits the wafer W with the resist film formed thereon back in the original position in the container C. The wafer W may be heat-treated as appropriate in heating and cooling units HP and CP before and/or after the treatment in the resist coating unit SC. Such treatment is carried out also for other wafers W, to obtain beforehand a predetermined number of wafers W having resist film formed thereon. All the above operations take place under control of the first controller 71.

Treatments relating to an apparatus other than the exposing apparatus 3 are permitted until the time for starting the above treatment to form resist film.

<Transport from Coating & Developing Apparatus to Exposing Apparatus.>

The first controller 71 operates the overhead transport mechanism 5. Then, the overhead transport mechanism 5 transports a predetermined container C placed on the container support table 21 to the container support table 45 of the exposing apparatus 3.

<Exposure and Post-Exposure Bake>

When the container C is placed on the container support table 45, the exposing apparatus 3 will operate as follows. The transporting system TR2 fetches a wafer W from the container C placed on the container support table 45, and transports the wafer W to the exposing machine 37. The exposing machine 37 exposes the wafer W twice in succession. The transporting system TR2 transports the wafer W from the exposing machine 37 to one of the heating units HP. The heating unit HP heats the wafer W for a predetermined time (post-exposure bake). The transporting system TR2 transports the wafer W from the heating unit HP to one of the cooling units CP. The cooling unit CP cools the wafer W. This stops reaction of the resist film in the exposed portion. Finally, the transporting system TR2 unloads the wafer W from the cooling unit CP, and deposits the wafer W back in the original position in the container C. All the above operations take place under control of the second controller 73.

<Transport from Exposing Apparatus to Coating and Developing Apparatus>

The second controller 73 operates the overhead transport mechanism 5. Then, the overhead transport mechanism 5 transports a predetermined container C from the container support table 45 to the container support table 21.

<Development>

When the container C is placed on the container support table 21, the coating and developing apparatus 1 will operate as follows. The transporting system TR1 fetches a wafer W from the container C placed on the container support table 21, and transports the wafer W to one of the developing units SD. The developing unit SD supplies the developer to the wafer W for developing treatment. The transporting system TR1 deposits the developed wafer W back in the original position in the container C. The wafer W may be heat-treated as appropriate in heating and cooling units HP and CP before and/or after the treatment in the developing unit SD.

<No Scheduled Operation>

When a communication between the first controller 71 and second controller 73 shows no scheduled operation of the resist coating units SC or developing units SD, the coating and developing apparatus 1 can engage in operations relating to an apparatus (not shown) other than the exposing apparatus 3. Specifically, the first controller 71 is permitted to make a schedule adjustment to treat wafers W for transfer to an apparatus other than the exposing apparatus 3, and determine an operating schedule for the resist coating units SC and developing units SD relating to the apparatus (not shown) other than the exposing apparatus 3.

According to the substrate treating system in this embodiment, as described above, the coating and developing apparatus 1 is constructed separately from the exposing apparatus 3 having the exposing machine 37. Thus, even when the processing time of the exposing machine 37 increases due to double exposure, for example, the operating rate of the coating and developing apparatus 1 is not influenced by the increased processing time. The coating and developing apparatus 1 can be operated efficiently since treatment relating to an apparatus other than the exposing apparatus 3 is permitted.

The first controller 71 and second controller 73 capable of communicating with each other can compare and coordinate treatment schedules of the coating and developing apparatus 1 and exposing apparatus 3. This allows the coating and developing apparatus 1 to be operated appropriately. In other words, the coating and developing apparatus 1 never feeds wafers W to the exposing apparatus 3 at times inconvenient to the treating process by the exposing machine 37, or feeds wafers W in excess of the treating capacity of the exposing machine 37. Since scheduled times of treatment by the exposing machine 37 and of treatment by the developing units SD are presumable beforehand, these treatments can be carried out appropriately.

With the overhead transport mechanism 5 operable by the first controller 71 and second controller 73, coordination between the coating and developing apparatus 1 and exposing apparatus 3 is secured in a suitable way.

This invention is not limited to the foregoing embodiment, but may be modified as follows:

(1) In the foregoing embodiment, the schedules for the coating and developing apparatus 1 and exposing apparatus 3 are adjusted in the form of the first controller 71 asking information from the second controller 73, and the latter answering the request. The method of adjustment is not limited to this. For example, a change may be made such that inquiries are made from the second controller 73 to the first controller 71. The second controller 73 may pass an operating schedule of the exposing machine 37 to the first controller 71, and the first controller 71 may then make adjustment to add a new operating schedule to fill an idle period in the operating schedule of the exposing machine 37. Although time, period, the number of wafers W have been noted as items for adjustment, these are given only by way of example and may be varied as appropriate.

Figure 6:
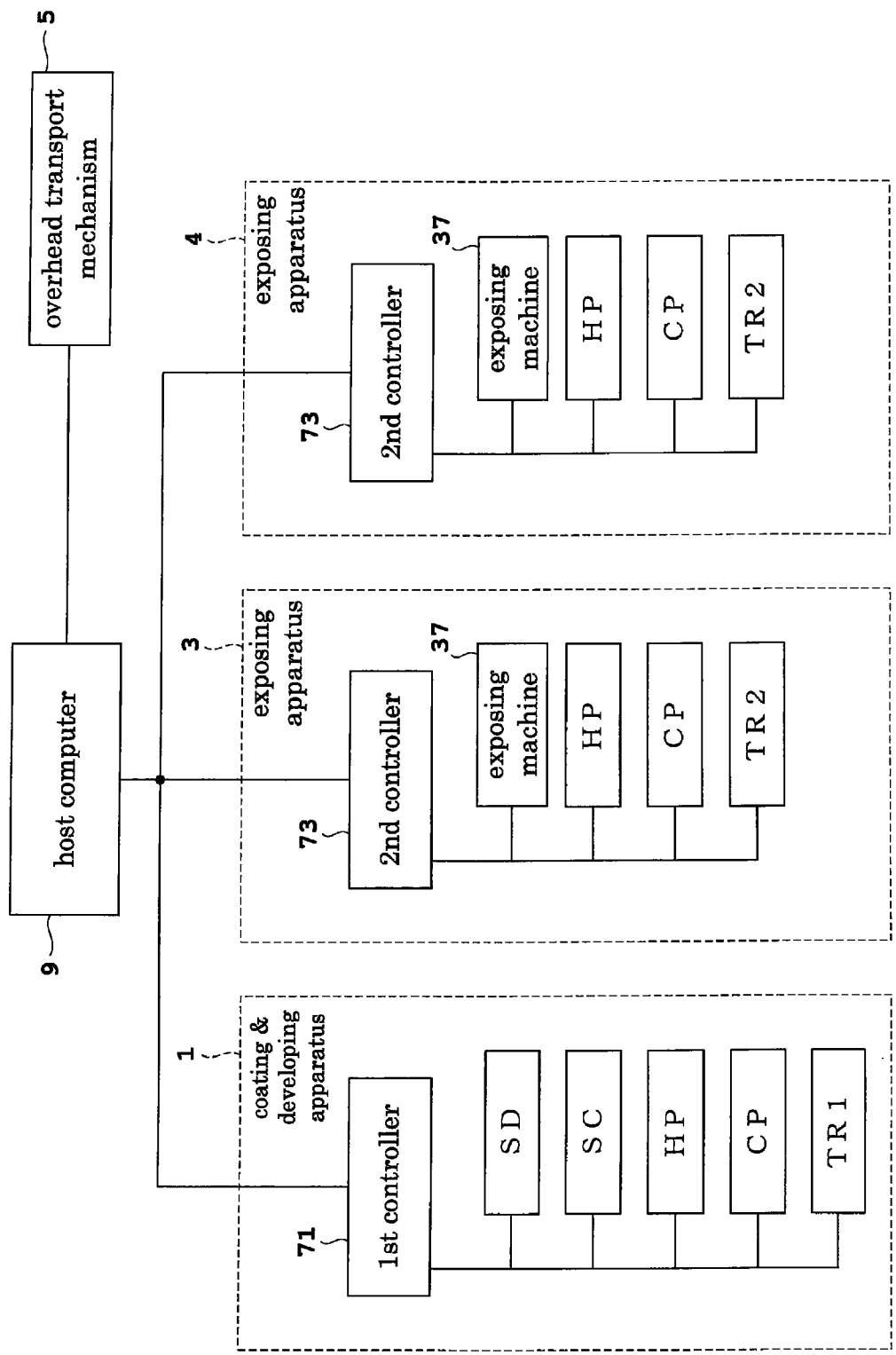
FIG. 6 is a block diagram of a control system of a substrate treating system in a modified embodiment.

(2) In the foregoing embodiment, the substrate treating system includes the coating and developing apparatus 1 and exposing apparatus 3 for treating wafers W. The number of apparatus may be changed to three or more. FIG. 6 refers, which is a block diagram of a control system in a modified substrate treating system. As seen, this substrate treating system is constructed to have a coating and developing apparatus 1, an exposing apparatus 3 and an exposing apparatus 4 cooperable with one another. The exposing apparatus 4 is constructed similar to the exposing apparatus 3. That is, the exposing apparatus 4 includes an indexer block 31, a PEB block 33, an interface block 35 and an exposing machine 37 connected in-line (see FIGS. 4A and 4B). This construction can allow the coating and developing apparatus 1 to be operated efficiently even with an increase in the time taken in exposing wafers W.

(3) In the foregoing embodiment, the first and second controllers 71 and 73 can communicate with each other, and also with the overhead transport mechanism 5. The invention is not limited to this. As shown in FIG. 6, for example, the first and second controllers 71 and 73 may be constructed to communicate with a host computer 9. The host computer 9 may have functions to adjust treatment schedules of the coating and developing apparatus 1 and exposing apparatus 3, and gives timing of each treatment, the number of wafers W to be treated, and so on to the first and second controllers 71 and 73. In this case, the host computer 9 may operate the overhead transport mechanism 5.

(4) In the foregoing embodiment, the coating and developing apparatus 1 includes the resist block 13 having resist coating units SC arranged therein, and the developing block 15 having developing units SD arranged therein. The invention is not limited to such arrangement. For example, the coating and developing apparatus 1 may be modified to further include a block having etching units for etching developed wafers W, a block having resist removing units for removing resist patterns from wafers W, or a block having cleaning units for cleaning wafers W.

Further, the resist block 13 and developing block 15 may be arranged in different apparatus. FIG. 7 refers, which is a schematic view showing an outline of a modified substrate treating system. As seen, the modified system includes a coating apparatus 75, an exposing apparatus 3 and a developing apparatus 77. An overhead transport mechanism 5 is constructed to transport containers C between these apparatus 75, 3 and 77. The coating apparatus 75 includes an indexer block 11, and a resist block 13 having resist coating units SC. The developing apparatus 77 includes an indexer block 11, and a developing block 15 having developing units SD. As seen, the developing apparatus 77 further includes an etching block 78 having the above-mentioned etching units arranged therein, and a cleaning block 79 having cleaning units arranged therein, for performing various treatments of wafers W in the respective blocks.

In FIG. 7, either the coating apparatus 75 or the developing apparatus 77 may be omitted. Thus, the substrate treating system may be modified to include the coating apparatus 75 and exposing apparatus 3, or the exposing apparatus 3 and developing apparatus 77.

Figure 8A:
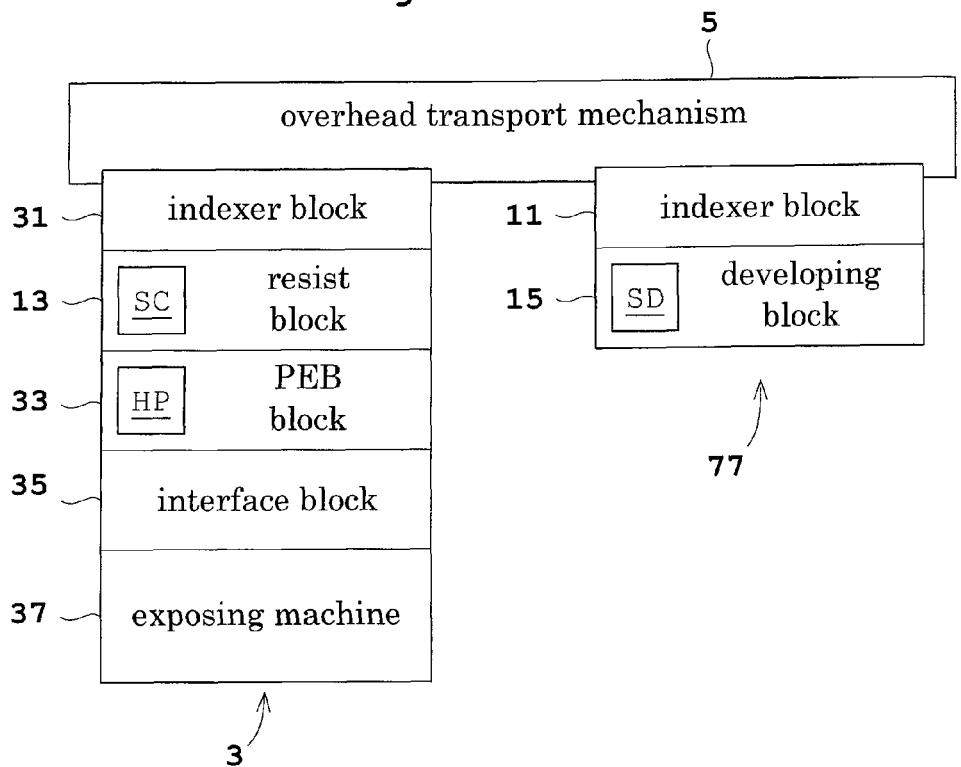
FIG. 8A is a schematic view showing an outline of a substrate treating system in a further modified embodiment.
Figure 8B:
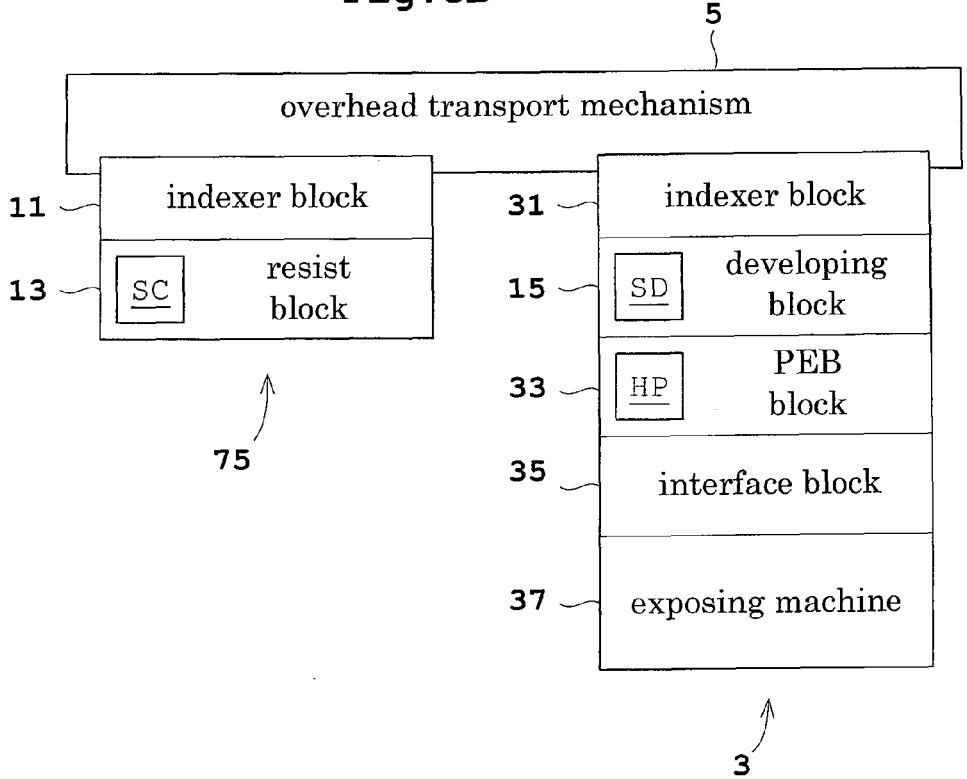
FIG. 8B is a schematic view showing an outline of a substrate treating system in a still further modified embodiment.

(5) In the foregoing embodiment, the exposing apparatus 3 has the PEB block 33 and exposing machine 37 arranged in juxtaposition. However, the invention is not limited to such arrangement. As shown in FIG. 8A, for example, the exposing apparatus 3 may be modified to include a resist block 13. As shown in FIG. 8B, the exposing apparatus 3 may be modified to include a developing block 15. What is provided separately from the exposing apparatus 3 may be only a developing apparatus 77 having developing units SD (see FIG. 8A), or may be only a coating apparatus 75 having resist coating units SC (see FIG. 8B). In such a case also, the coating apparatus 75 or developing apparatus 77 provided separately from the exposing apparatus 3 can be operated efficiently.

(6) In the foregoing embodiment, the overhead transport mechanism 5 is provided for transporting containers C between the coating and developing apparatus 1 and exposing apparatus 3. The invention is not limited to this construction. Instead, for example, a transport mechanism movable on the floor level may be used to transport containers C.

(7) In the foregoing embodiment, the exposing machine 37 is operable to expose each wafer W twice in succession. This may be modified to expose each wafer W once, or three or more times.

(8) Each of the modified substrate treating systems described in paragraphs (1) to (7) above may be further modified as appropriate by replacement or combination with the other modification(s).

This invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating system comprising:
a coating apparatus including a resist coating unit for forming resist film on substrates;
an exposing apparatus constructed separately from said coating apparatus with a spacing therebetween, and including an exposing machine for exposing the substrates having the resist film formed thereon, and a heat-treating unit for heating the substrates exposed;
each of said coating apparatus and said exposing apparatus including an indexer block for moving the substrates into and out of a container constructed for storing a plurality of substrates;
a transport device disposed outside said coating apparatus and said exposing apparatus for transporting said container between the respective indexer blocks of said coating apparatus and said exposing apparatus; and
a control device configured to control said resist coating unit, said exposing machine, said heat-treating unit and said transport device, said control device being configured to adjust schedules of treatments in said coating apparatus and said exposing apparatus;
wherein said control device and said transport device are further configured, when said coating apparatus is resting from treatment of substrates to be transferred to said exposing apparatus, to permit treatment of substrates to be transferred via said space to an apparatus other than said exposing apparatus.

2. The substrate treating system as defined in claim 1, wherein:
said coating apparatus includes a first controller for controlling said coating unit;
said exposing apparatus includes a second controller for controlling said exposing machine and said heat-treating unit, said second controller being capable of communicating with said first controller; and said control device comprises said first controller and said second controller.

3. The substrate treating system as defined in claim 2, wherein said control device further includes a host computer in communication with said first controller and said second controller.

4. The substrate treating system as defined in claim 1, wherein:

said container placed on the indexer block of said coating apparatus and said container placed on the indexer block of said exposing apparatus are arranged linearly; and said transport device is arranged to transport said container along a transport path located on a straight line extending between the indexer block of said coating apparatus and the indexer block of said exposing apparatus.

5. The substrate treating system as defined in claim 1, wherein said coating apparatus further includes a developing unit for developing the substrates exposed.

6. The substrate treating system as defined in claim 1, wherein said exposing machine and said heat-treating unit are connected in-line with each other.

7. The substrate treating system as defined in claim 1, wherein said exposing apparatus further includes a developing unit for developing the substrates exposed.

8. The substrate treating system as defined in claim 1, further comprising a developing apparatus, constructed separately from said coating apparatus and said exposing apparatus with a spacing therebetween, for developing the substrates exposed.

9. The substrate treating system as defined in claim 1, wherein said resist film is a chemically amplified type.

10. A substrate treating system comprising:

an exposing apparatus including an exposing machine for exposing substrates, and a heat-treating unit for heating the substrates exposed;

a developing apparatus constructed separately from said exposing apparatus with a spacing therebetween, and including a developing unit for developing the substrates exposed;

each of said developing apparatus and said exposing apparatus including an indexer block for moving the substrates into and out of a container constructed for storing a plurality of substrates;

a transport device disposed outside said developing apparatus and said exposing apparatus for transporting said container between the respective indexer blocks of said developing apparatus and said exposing apparatus; and a control device configured to control said exposing machine, said heat-treating unit, said developing unit and said transport device, said control device being configured to adjust schedules of treatments in said exposing apparatus and said developing apparatus;

wherein said control device and said transport device are further configured, when said developing apparatus is resting from treatment of substrates transferred from said exposing apparatus, to permit treatment of substrates transferred via said space from an apparatus other than said exposing apparatus.

11. The substrate treating system as defined in claim 10, wherein:

said developing apparatus includes a first controller for controlling said developing unit;

said exposing apparatus includes a second controller for controlling said exposing machine and said heat-treating unit, said second controller being capable of communicating with said first controller; and said control device comprises said first controller and said second controller.

12. The substrate treating system as defined in claim 11, wherein said control device further includes a host computer in communication with said first controller and said second controller.

13. The substrate treating system as defined in claim 10, wherein:

said container placed on the indexer block of said developing apparatus and said container placed on the indexer block of said exposing apparatus are arranged linearly; and said transport device is arranged to transport said container along a transport path located on a straight line extending between the indexer block of said developing apparatus and the indexer block of said exposing apparatus.

14. The substrate treating system as defined in claim 10, wherein said exposing machine and said heat-treating unit are connected in-line with each other.

15. The substrate treating system as defined in claim 10, wherein said exposing apparatus further includes a resist coating unit for forming resist film on the substrates.

16. The substrate treating system as defined in claim 10, further comprising a coating apparatus constructed separately from said developing apparatus and said exposing apparatus with a spacing therebetween, and including a resist coating unit for forming resist film on the substrates.

* * * * *